United States Patent [19]

Nakata et al.

[11] Patent Number: 6,124,220
[45] Date of Patent: Sep. 26, 2000

[54] LAMINATED BOARD AND PROCESS FOR PRODUCTION THEREOF

[75] Inventors: Takahiro Nakata, Fujieda; Takahisa Iida, Yaizu; Takashi Yamaguchi; Toshihide Kanazawa, both of Fujieda, all of Japan

[73] Assignee: Sumitomo Bakelite Company Limited, Tokyo, Japan

[21] Appl. No.: 08/714,264

[22] Filed: Sep. 17, 1996

[30] Foreign Application Priority Data

| Mar. 28, 1995 | [JP] | Japan | 7-070084 |
| Jun. 27, 1995 | [JP] | Japan | 7-161227 |
| Feb. 29, 1996 | [JP] | Japan | 8-043446 |

[51] Int. Cl.$^7$ ................................... B32B 27/38
[52] U.S. Cl. .......................... 442/175; 442/180; 442/275; 442/278; 442/281; 442/284; 442/295; 442/391; 442/393; 442/412; 428/34.5; 428/34.6; 428/34.7; 428/206; 428/207; 428/209; 428/221; 428/301.4; 428/901
[58] Field of Search ................................. 428/34.5, 34.6, 428/34.7, 206, 207, 209, 221, 901; 442/391, 393, 175, 180, 275, 278, 281, 284, 295, 412

[56] References Cited

U.S. PATENT DOCUMENTS

| 2,956,613 | 10/1960 | Edelman et al. |
| 3,109,763 | 11/1963 | Finger. |
| 3,617,613 | 11/1971 | Benzinger. |
| 3,639,202 | 2/1972 | Simon. |
| 4,492,730 | 1/1985 | Oishi et al. ............................. 428/328 |
| 4,671,984 | 6/1987 | Maeda et al. ........................... 428/209 |
| 4,751,146 | 6/1988 | Maeda et al. ........................... 428/475.8 |
| 4,769,270 | 9/1988 | Nagamatusu et al. .................. 428/131 |
| 5,077,115 | 12/1991 | Arthur et al. ............................. 428/137 |
| 5,354,585 | 10/1994 | Shibata et al. |

FOREIGN PATENT DOCUMENTS

| 2224293 | 10/1974 | France. |
| 2203672 | 8/1973 | Germany. |
| 3907505 | 9/1989 | Germany. |
| 6302926 | 10/1994 | Japan. |
| 0726567 | 3/1955 | United Kingdom. |
| 0777586 | 6/1957 | United Kingdom. |

OTHER PUBLICATIONS

"Laminated Board for Printed Circuits", Yozo Shioda et al., Japanese Patent Application 06302926.
Sumitomo Bakelite Co Ltd., Production of Laminate for Printed Circuit, Patent Abstracts of Japan, 095:010, Nov. 30, 1995.
Sumitomo Bakelite Co Ltd., Laminated Board for Printed Circuit, Patent Abstracts of Japan, 013:414, Sep. 13, 1989.
Sumitomo Bakelite Co Ltd., Multilayer Board Produce Print Circuit Forming Board Surface Glass Woven Cloth Impregnate Polyepoxide Resin Intermediate Layer Glass Cloth Impregnate Polye$_p$oxide Resin Inorganic Fill, Derwent Publications Ltd., JP4215492, Aug. 6, 1992.

*Primary Examiner*—Blaine Copenheaver
*Assistant Examiner*—Arti R. Singh
*Attorney, Agent, or Firm*—Browdy and Neimark

[57] ABSTRACT

A laminated board comprising an intermediate layer and two surface layers formed thereon, in which board the intermediate layer comprises a central layer made of a nonwoven glass fiber fabric impregnated with a resin composition containing a thermosetting resin and an inorganic filler and upper and lower layers formed on the central layer, each being made of said resin composition containing a thermosetting resin and an inorganic filler, and the two surface layers formed on the intermediate layer are made of a thermosetting resin-impregnated fiber substrate; and a process for production of the laminated board.

10 Claims, 2 Drawing Sheets

LAMINATED BOARD AND PROCESS FOR PRODUCTION THEREOF

BACKGROUND OF THE INVENTION (1) Field of the Invention

The present invention relates to a laminated board suitably used for printed circuit boards used in electric apparatuses, electronic apparatuses, communication apparatuses, etc.; as well as to a process for production of the laminated board.

(2) Related Art Statement

With the advance of home-use electronic apparatuses into smaller sizes and higher performances, there have come to be used, as printed circuit basic materials used therein, laminated boards obtained by impregnating a nonwoven glass fiber fabric (as a substrate for intermediate layer) and a woven glass fiber fabric (as a substrate for surface layers) with an epoxy resin and subjecting the resulting fabrics to hot pressing (the laminated boards are hereinafter referred to as "composite laminated board"). Recently, it has become necessary that these composite laminated boards possess (1) punchability comparable to that of laminated boards comprising a paper substrate and a phenolic resin, heretofore used in the art and (2) a low cost.

Also in industrial-use electronic apparatuses, composite laminated boards have come to be used in which no woven glass fiber fabric is used or the amount thereof is decreased for cost reduction. These laminated boards, however, are inferior to laminated boards using a woven glass fiber fabric as a substrate, in various performance respects, and it has become necessary that they show a small dimensional change and a small warpage both comparable to those of the latter boards.

OBJECT OF THE INVENTION

In order to satisfy the above-mentioned requirements for composite laminated boards, it was studied to use, in place of the nonwoven glass fiber fabric as a substrate for intermediate layer, a resin varnish containing a glass single fiber. This approach shows improvements in dimensional change and warpage but has various problems in production of the intended composite laminated board, and is not yet in practical use. It was also studied to reduce the proportion of woven or nonwoven glass fiber fabric for cost reduction; however, the reduction in cost is not easy owing to the restrictions associated with performance and production of the intended composite laminated board.

Under such circumstances, the present inventors made a study in order to achieve the cost reduction of the composite laminated board with the performance being maintained or improved. As a result, the present inventors have completed the present invention.

The object of the present invention lies in providing a laminated board suitably used in printed circuit basic materials, which is improved in insulation between through-holes, punchability, dimensional change and warpage without impairing the electrical properties and other properties and which has a low cost; and a process for production of the laminated board.

SUMMARY OF THE INVENTION

The present invention provides a laminated board comprising an intermediate layer and two surface layers formed thereon, in which board the intermediate layer comprises a central layer made of a nonwoven glass fiber fabric impregnated with a resin composition containing a thermosetting resin and an inorganic filler and upper and lower layers formed on the central layer, each being made of said resin composition containing a thermosetting resin and an inorganic filler, and the two surface layers formed on the intermediate layer are made of a thermosetting resin-impregnated fiber substrate. In the laminated board, the fiber substrate of the two surface layers is preferably a woven glass fiber fabric.

The present invention furthermore provides a process for producing a laminated board, which comprises:

a step of coating, on one side of a fiber substrate of long length, a varnish of a thermosetting resin containing an inorganic filler, a step of laminating a nonwoven glass fiber fabric on the varnish-coated side of the fiber substrate to obtain a laminate, a step of heat-drying the laminate to obtain a prepreg, and a step of laminating two of the thus-formed prepregs so that the respective nonwoven glass fiber fabrics face each other, and subjecting the resultant laminate to hot pressing.

The present invention moreover provides a process for producing a laminated board, which comprises:

a step of coating, on one side of a fiber substrate of long length, a varnish of a thermosetting resin containing an inorganic filler, a step of heat-drying the varnish-coated fiber substrate, a step of laminating a nonwoven glass fiber fabric on the varnish-coated side of the fiber substrate to obtain a laminate, a step of heat-drying the laminate to obtain a prepreg, and a step of laminating two of the thus-formed prepregs so that the respective nonwoven glass fiber fabrics face each other, and subjecting the resultant laminate to hot pressing.

Figure 1:
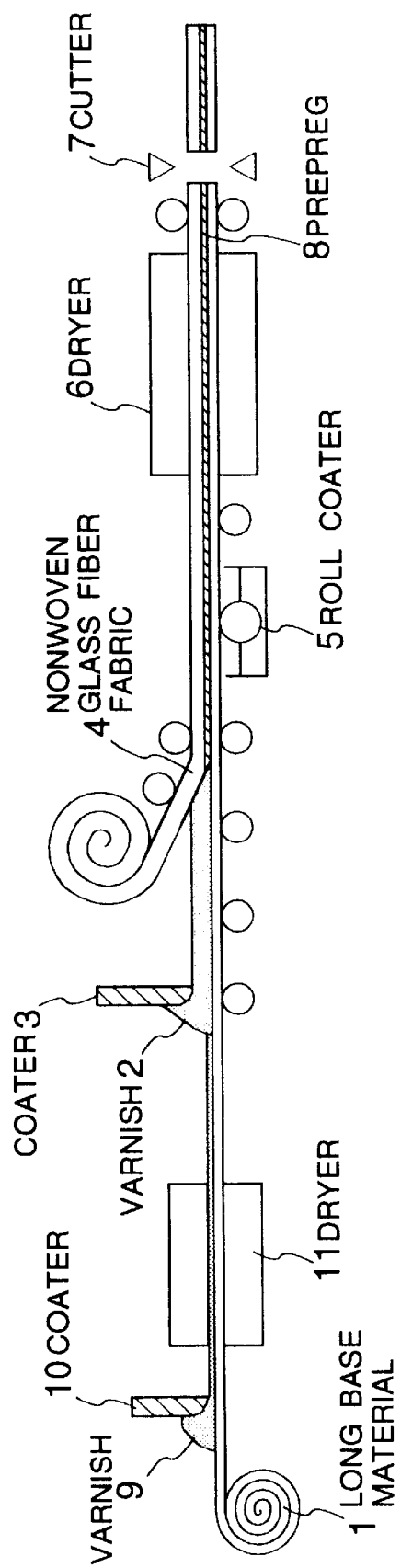
FIGS. 1 and 2 are each a schematic sectional view showing an example of the steps up to prepreg formation, in production of the laminated board of the present invention. In these drawings, each numeral refers to the following.

1: a substrate of long length, 2: a varnish, 3: a coater, 4: a nonwoven glass fiber fabric, 5: a roll coater, 6: a dryer, 7: a cutter, 8: a prepreg, 9: a varnish, 10: a coater, 11: a dryer, 12: a dryer

DETAILED DESCRIPTION OF THE INVENTION

In the laminated board of the present invention, an inorganic filler is added to the thermosetting resin used. Thereby, the present laminated board can be improved in punchability and dimensional stability and, moreover, can have improved through-hole reliability owing to the reduced thermal expansion in Z direction. In addition, while in conventional laminated boards, a nonwoven glass fiber fabric is used in the whole portion of the intermediate layer, a nonwoven glass fiber fabric is used, in the present laminated board, only in the central layer of the intermediate layer to reduce the amount of the nonwoven glass fiber fabric used, whereby the voids present in the intermediate layer can be reduced.

Use of a nonwoven glass fiber fabric in the central layer of the intermediate layer can improve the heat resistance and punchability of the present laminated board and can control the flow of resin during varnish impregnation and during molding. The nonwoven glass fiber fabric generally has a unit area weight of 20–150 g/m$^2$.

The inorganic filler used in the present invention includes aluminum hydroxide, magnesium hydroxide, calcium carbonate, clay, talc, silica, etc. The proportion of the inorganic filler in the resin composition is preferably 10–300% by weight, preferably 70–250% by weight based on the thermosetting resin. When the proportion is less than 10% by weight, improvements in punchability, dimensional stability and through-hole reliability are low. When the proportion is more than 300% by weight, uniform addition of the inorganic filler to the thermosetting resin, lamination and forming are difficult.

The thermosetting resin used in the present invention includes an epoxy resin, a polyimide resin, a polyester resin, a phenolic resin, an acrylic resin, etc., with the epoxy resin being particularly preferred. The epoxy resin includes, a bisphenol A type epoxy resin, a novolac type epoxy resin, etc.

The fiber substrate used in the surface layers are not particularly restricted and includes a woven glass fiber fabric, a nonwoven glass fiber fabric, a woven or nonwoven synthetic fiber fabric, a kraft paper, a linter paper, etc., with the woven glass fiber fabric being preferred in view of the heat resistance and strength.

When punchability and cost reduction are strongly required, a cellulose-based paper such as kraft paper, linter paper or the like is preferred.

In the present laminated board, the amount of the nonwoven glass fiber fabric used in the intermediate layer can be reduced as compared with the amount used in conventional composite laminated boards. That is, the intermediate layer of the present laminated board comprises (1) a central layer made of a nonwoven glass fiber fabric impregnated with a resin composition containing a thermosetting resin and an inorganic filler and (2) upper and lower layers formed on the central layer, made of said resin composition alone.

As a result, the voids present between the fibers constituting the nonwoven glass fiber fabric are reduced, and improvements in insulation between through-holes and heat resistance are obtained. Further, reduction in the use amount of nonwoven glass fiber fabric (which is expensive) can provide a laminated board of lower cost.

Next, description is made on the process for producing the laminated board of the present invention.

The present invention relates to a process for producing a laminated board, which comprises:

a step of coating, on one side of a fiber substrate of long length, a varnish of a thermosetting resin containing an inorganic filler, a step of laminating a nonwoven glass fiber fabric on the varnish-coated side of the fiber substrate to obtain a laminate, a step of heat-drying the laminate to obtain a prepreg, and a step of laminating two of the thus-formed prepregs so that the respective nonwoven glass fiber fabrics face each other, and subjecting the resultant laminate to hot pressing. This process is simple and enables continuous production, and can produce a laminated board having performances at least comparable to those of conventional composite laminated boards.

FIG. 1 shows an outline of an example of the steps of the present process up to prepreg production.

The upper side of a long substrate (1) sent from an unwinder is coated with a varnish (2) of a thermosetting resin containing an inorganic filler, by use of a coater (3) so as to give a desired film thickness.

Prior to the above step of coating the long substrate with the varnish of a thermosetting resin containing an inorganic filler, it is possible to coat, as an optional step, at least the same side of the long substrate with a varnish (9) of a thermosetting resin containing no inorganic filler. With this optional step, the adhesion between the long substrate and the thermosetting resin containing an inorganic filler can be improved. The varnish (9) of a thermosetting resin containing no inorganic filler, suitably has a relatively high resin solid content of 50–80% by weight. The coating of the varnish (9) can be conducted by use of a coater (10) such as a comma roll coater, a knife coater, a die coater, a reverse coater or the like, and the coating on only the upper side of the long substrate is sufficient. Any other means may also be applicable.

The varnish (9)—coated long substrate is dried by use of a dryer (11), after which the substrate is coated with a varnish (2) of a thermosetting resin containing an inorganic filler.

The varnish (2) generally has a solid content of thermosetting resin and inorganic filler, of 60–90% by weight.

With respect to the dilution of the varnish (2) with a solvent, a solvent-free varnish is preferred when the varnish before dilution has a relatively low viscosity. The amount of the varnish (2) applied is generally about 600–1,400 g (as varnish solid content) per m$^2$ of long substrate, although it varies depending upon the unit area weight of a nonwoven glass fiber fabric used in a later step, or depending upon the amount of a resin varnish (9) applied on the lower side of the long substrate when it is applied in a later step; and the thickness (before drying) of the varnish (2) is about 0.2–1.0 mm.

The coater (3) includes a comma role coater, a knife coater, a die coater, a reverse coater, etc. Since the varnish (2) is applied in a large thickness (0.2–1.0 mm) and the varnish must have a high viscosity, a means capable of applying a high-viscosity varnish, for example, a comma roll coater or a knife coater is preferred.

After coating the upper side of the long substrate with the varnish (2) of a thermosetting resin containing an inorganic filler, a nonwoven glass fiber fabric (4) is laminated on the varnish-coated side of the long substrate. Thereafter, as an optional step, a thermosetting resin varnish is coated on the uncoated side (back side) of the long substrate, as explained below. This coating is conducted generally by use of a roll coater (5), but other coating means may be used.

The thermosetting resin varnish coated on the back side of the long substrate, generally contains no inorganic filler. This coating of the thermosetting resin varnish is to supplement the prior coating of the varnish (2) of a thermosetting resin containing an inorganic filler, because the varnish (2) is not sufficiently impregnated into the long substrate in many cases. Accordingly, the amount of the thermosetting resin applied on the back side may be small and a thermosetting resin varnish having a resin solid content of about 10–30% by weight is generally used to achieve uniform impregnation.

The resulting material is then heat-dried by use of a dryer (6) to obtain a thermosetting resin-impregnated prepreg. The heat-drying conditions are severer than usual, i.e. 120–180° C. and about 1–5 minutes, because the material has a large total thickness. The prepreg is then cut into a desired length by use of a cutter (7). Alternatively, the prepreg is not cut and may be used as such for continuous molding.

In this prepreg, a layer of an inorganic filler-containing thermosetting resin alone is present between a substrate impregnated with a thermosetting resin (containing a small amount of an inorganic filler) and a nonwoven glass fiber fabric impregnated with an inorganic filler-containing thermosetting resin.

Two of the thus-obtained prepregs are laminated with each other so that the nonwoven glass fiber fabric sides face each other, and the laminate is subjected to hot pressing. This hot pressing is conducted generally by laminating two of the prepregs cut into a desired length and using a multiplaten press, but it is also possible to conduct continuous hot pressing by laminating two of the uncut long prepregs so that the nonwoven glass fiber fabric sides face each other. The former noncontinuous hot pressing is generally conducted when the resin used is an epoxy resin; and the appropriate conditions thereof are generally 150–180° C. (temperature), 20–70 kg/cm$^2$ (pressure) and 60–120 minutes (time) similarly to those employed in production of conventional composite laminated boards, although the conditions vary depending upon the fluidity of the resin used for impregnation. When a polyester resin or a photosetting acrylic resin is used, the latter continuous hot pressing (wherein a low pressure can be used) can be employed.

Figure 2:
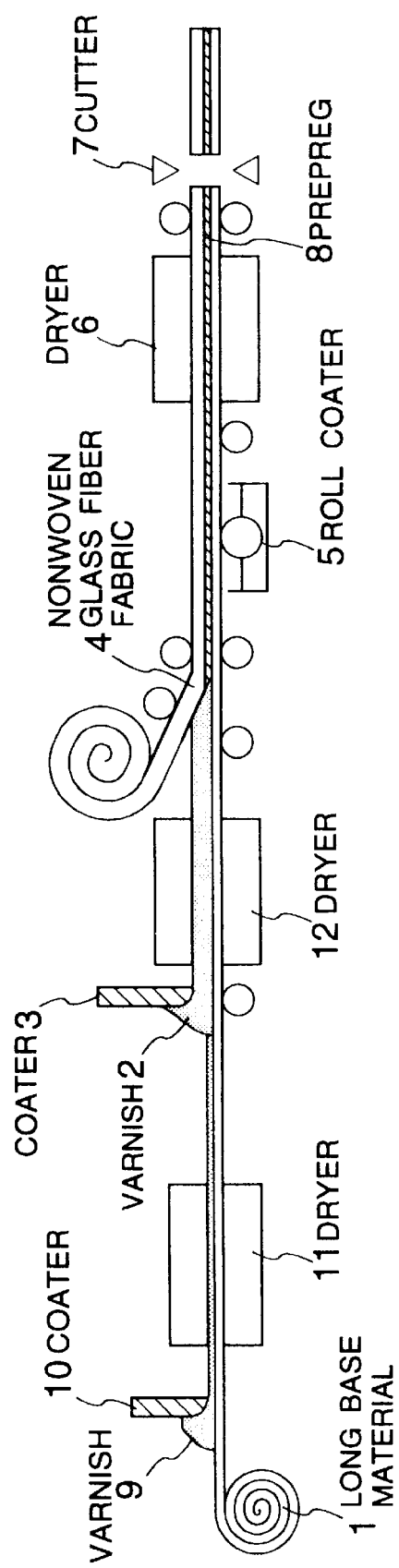

In the above process for production of the present laminated board, when the varnish of a thermosetting resin containing an inorganic filler contains a solvent (this is an ordinary case), voids are formed in the prepreg because of the vaporization of the solvent in the heat-drying step after lamination of a nonwoven glass fiber fabric on the varnish-coated long substrate; and these voids remain even in the laminated board after hot pressing and, in some cases, adversely affect the electrical properties (e.g. insulating property) of the laminated board. This problem can be solved by adding, between the step of coating, on one side of a fiber substrate of long length, a varnish of a thermosetting resin containing an inorganic filler and the step of laminating a nonwoven glass fiber fabric on the varnish-coated side of the fiber substrate, a step of heat-drying the varnish-coated substrate. FIG. 2 shows an outline of an example of the steps of the present process up to prepreg production, employed in such a case.

The above-mentioned thermosetting resin varnish is coated on a long substrate, and the coated substrate is passed through a dryer (12) to evaporate the solvent contained in the varnish. The heat-drying conditions used in the dryer are generally 80–160° C. and about 30 seconds to 5 minutes although they vary depending upon the kind and amount of the solvent used. Then, a nonwoven glass fiber fabric (4) is laminated on the varnish-coated side of the substrate and the subsequent steps are conducted in the same manner as mentioned above, whereby a laminated board according to the present invention can be obtained.

The composite laminated board of the present invention can be obtained by using the above-mentioned steps. In this embodiment of the present invention, a varnish of a thermosetting resin containing an inorganic filler is coated on a long substrate (e.g. a woven glass fiber fabric), followed by drying, after which a nonwoven glass fiber fabric is laminated on the varnish-coated substrate. Therefore, the coating and impregnation steps are simple even when subsequently a resin varnish is applied on the back side of the substrate, and the amount of nonwoven glass fiber fabric (which is relatively expensive) used can be reduced. Further, drying before lamination of nonwoven glass fiber fabric can prevent voids generation caused by solvent, which has enabled production of prepreg of good moldability. Furthermore, since the nonwoven glass fiber fabric moves together with the long substrate, there occurs neither breakage of the nonwoven glass fiber fabric nor scattering of the bits of the glass fiber. Consequently, there is little trouble in production of the present composite laminated board, and the laminated board obtained has a lower cost.

DESCRIPTION OF PREFERRED EMBODIMENTS

The present invention is hereinafter described specifically by way of Examples and Comparative Examples.

EXAMPLE 1

A roll of a long substrate (a woven glass fiber fabric, WE-18K RB-84, product of Nitto Boseki Co., Ltd.) was unwinded. On the upper side of the unwinded woven glass fiber fabric was coated an epoxy resin varnish P having the following formulation, by use of a knife coater so as to give a film thickness (as dried) of about 50 μm.

| Formulation of varnish P | |
|---|---|
| Brominated epoxy resin (EP-1046, product of Yuka Shell Epoxy K.K.) [containing a curing agent (dicyandiamide) and a curing accelerator] | 70 parts by weight |
| Solvent (methyl cellosolve) | 30 parts by weight |

Then, drying was conducted at 120° C. for 1 minute. Subsequently, a varnish A1 having the following formulation was coated on the varnish P-coated side of the substrate by use of a knife coater so as to give a film thickness (before drying) of 0.9 mm.

| Formulation of varnish A1 | |
|---|---|
| Brominated epoxy resin (same as mentioned above) | 100 parts by weight |
| Inorganic filler (aluminum hydroxide) | 80 parts by weight |
| Ultrafine powder silica | 20 parts by weight |
| Solvent (methyl cellosolve) | 30 parts by weight |

Next, on the varnish A1-coated side of the substrate was laminated a nonwoven glass fiber fabric (EP-4075, product of Japan Vilene Co., Ltd.) having a unit area weight of 75 g/m². On the back side of the substrate was coated a varnish B1 having the following formulation, by use of a roll coater.

| Formulation of varnish B1 | |
|---|---|
| Brominated epoxy resin (same as mentioned above) | 30 parts by weight |
| Solvent (methyl cellosolve) | 70 parts by weight |

The resulting material was dried at 140° C. for 3 minutes by use of a dryer to obtain a prepreg comprising a woven glass fiber fabric and a nonwoven glass fiber fabric. The prepreg was cut into 2-m pieces. Two of these pieces were laminated so that the respective nonwoven glass fiber fabric sides faced each other. On the upper and lower sides of the resulting laminate was placed a 18-μm copper foil, followed by hot pressing at 165° C. under 60 kg/cm² for 90 minutes, to prepare a copper-clad laminated board having a thickness of 1.6 mm.

EXAMPLE 2

A roll of a long substrate (a woven glass fiber cloth, WE-18K RB-84, product of Nitto Boseki Co., Ltd.) was unwinded. On the upper side of the substrate was coated the varnish P, followed by drying, in the same manner as in Example 1. On the varnish P-coated side of the substrate was coated a varnish A2 having the following formulation, by use of a knife coater so as to give a film thickness (before drying) of 0.9 mm.

| Formulation of varnish A2 | |
|---|---|
| Brominated epoxy resin (same as mentioned above) | 100 parts by weight |
| Inorganic filler (aluminum hydroxide) | 100 parts by weight |
| Ultrafine powder silica | 25 parts by weight |
| Solvent (methyl cellosolve) | 50 parts by weight |

The resulting material was dried at 150° C. for 1 minute by use of a dryer. The subsequent procedures were carried out as mentioned in Example 1 to prepare a copper-clad laminated board having a thickness of 1.6 mm.

EXAMPLE 3

An epoxy resin varnish B3 having the following formulation was prepared.

| Formulation of varnish B3 | |
|---|---|
| Brominated epoxy resin (same as mentioned above) | 100 parts by weight |
| Methyl cellosolve | 30 parts by weight |
| Acetone | 60 parts by weight |

The above varnish B3 was impregnated into a long substrate (a woven glass fiber fabric, WE-18K RB-84, product of Nitto Boseki Co., Ltd.) so that the resin content in the impregnated substrate became about 40% by weight, followed by drying at 140° C. for 2 minutes, to obtain a woven glass fiber fabric prepreg [A].

Separately, the following inorganic fillers of the following amounts were added to the above-mentioned varnish B3 containing 100 parts by weight of the brominated epoxy resin, followed by stirring, to prepare a varnish A3 containing the brominated epoxy resin and inorganic fillers.

| | |
|---|---|
| (1) Silica (Crystallite VX-3, product of Tatsumori) | 25 parts by weight |
| (2) Aluminum hydroxide | 70 parts by weight |
| (3) Ultrafine powder silica | 5 parts by weight |

The varnish A3 was coated on one side of the woven glass fiber fabric prepreg [A] by use of a knife coater so as to give a film thickness (as dried) of 0.6 mm. Thereon was laminated a nonwoven glass fiber fabric (EP-4075, product of Japan Vilene Co., Ltd.) having a unit area weight of 75 g/m², followed by drying at 140° C. for 3 minutes, to obtain a prepreg [B]. Two of the prepregs [B] were laminated with each other so that the respective nonwoven glass fiber fabric sides faced each other. On the upper and lower sides of the resulting laminate was placed a 18-μm copper foil. The resulting material was subjected to hot pressing at 165° C. under 60 kg/cm² for 90 minutes to obtain a copper-clad laminated board having a thickness of 1.6 mm.

COMPARATIVE EXAMPLE 1

The brominated epoxy resin used in Example 1 was diluted with the solvent used in the same Example (methyl cellosolve) to prepare a varnish having a resin solid content of 60% by weight and a viscosity of 0.3 poise. This varnish was coated on and impregnated into the woven glass fiber fabric (WE-18K RB-84, product of Nitto Boseki Co., Ltd.) used in Example 1, by dipping, followed by drying at 140° C. for 2 minutes, to prepare a prepreg for surface layer. The above-prepared varnish was also coated on and impregnated into a nonwoven glass fiber fabric (EP-4075, product of Japan Vilene Co., Ltd.) by dipping, followed by drying at 140° C. for 2 minutes to prepare a prepreg for intermediate layer. Four of the prepregs for intermediate layer were laminated. On the upper and lower sides of the resulting laminate was placed the prepreg for surface layer. On the upper and lower sides of the resulting material was placed a 18-μm copper foil, followed by hot pressing, to obtain a copper-clad laminated board having a thickness of 1.6 mm.

COMPARATIVE EXAMPLE 2

A woven glass fiber fabric prepreg for surface layer was prepared in the same manner as in Comparative Example 1.

Separately, a varnish C having the following formulation was prepared.

| Formulation of varnish C | |
|---|---|
| Brominated epoxy resin (same as mentioned above) | 100 parts by weight |
| Inorganic filler (aluminum hydroxide) | 80 parts by weight |
| Ultrafine powder silica | 20 parts by weight |
| Solvent (methyl cellosolve) | 65 parts by weight |

This varnish C was coated on and impregnated into a nonwoven glass fiber fabric (EP-4075, product of Japan Vilene Co., Ltd.) by dipping, followed by drying at 140° C. for 3 minutes, to prepare a prepreg for intermediate layer.

Three of the prepregs for intermediate layer were laminated. On the upper and lower sides of the laminate was placed the prepreg for surface layer. On the upper and lower sides of the resulting material was placed a 18-μm copper foil, followed by hot pressing, to obtain a copper-clad laminated board having a thickness of 1.6 mm.

The copper-clad laminated boards obtained in the above Examples and Comparative Examples were measured for insulation between through-holes, punchability, dimensional change, bending strength, etc. by the following test methods. The results are shown in Table 1.

Test Methods

1. Insulation between through-holes

Insulation resistance (Ω) between two through-holes (minimum distance between the walls of the two: 0.5 mm) was measured after 1,000-hour treatment under the conditions of 60° C. and 90% R.H.

2. Punchability

Measured by ASTM method.
o: Good
Δ: Slightly inferior

3. Warpage

A test piece having a length of 300 mm of a copper-clad laminated board was heated at 170° C. for 30 minutes, and the maximum warpage (mm) of the resulting test piece was measured.

4. Dimensional change

A test piece of a copper-clad laminated board, having a hole-to-hole distance of 250 mm was heated at 170° C. for 30 minutes, and the dimensional change (%) of the hole-to-hole distance was measured.

5. Bending strength

Bending strength (N/mm$^2$) at ordinary state was measured by JIS C 6481.

6. Thermal expansion in Z direction

A copper-clad laminated board was subjected to whole-surface etching; was heated from room temperature to 200° C. at a rate of 10° C./min; and was measured for thermal expansion (%) in Z direction.

TABLE 1

|  | Example 1 | Example 2 | Example 3 | Comparative Example 1 | Comparative Example 2 |
|---|---|---|---|---|---|
| Insulation between through-holes (Ω) | $1 \times 10^{13}$ | $1 \times 10^{13}$ | $1 \times 10^{13}$ | $1 \times 10^{13}$ | $1 \times 10^{9}$ |
| Punchability | o~Δ | o | o | Δ | o~Δ |
| Warpage (mm) | 0–0.5 | 0–0.5 | 0–0.5 | 1.0–2.0 | 1.0–2.0 |
| Dimensional change (%) | | | | | |
| Longitudinal | 0–0.03 | 0–0.02 | 0–0.02 | 0–0.05 | 0–0.03 |
| Transverse | 0–0.04 | 0–0.03 | 0–0.03 | 0–0.06 | 0–0.04 |
| Bending strength (N/mm$^2$) | | | | | |
| Longitudinal | 410 | 435 | 425 | 380 | 405 |
| Transverse | 360 | 395 | 380 | 320 | 360 |
| Thermal expansion in Z direction (%) | 4.5 | 4.0 | 4.0 | 5.5 | 4.5 |

With respect to the production cost, the laminated boards obtained in Examples 1–3 could be produced at about 10%- to 20%-lower costs than those obtained in Comparative Examples 1–2 because, in the intermediate layer of each of Examples 1–3, the amount of a nonwoven glass fiber fabric (which is expensive) was reduced and not only a thermosetting resin but also an inorganic filler were impregnated into the nonwoven glass fiber fabric.

Thus, the laminated board of the present invention shows no reduction in bending strength, etc.; is superior in insulation between through-holes, punchability, warpage and dimensional stability; and has a low cost.

What is claimed is:

1. A laminated board comprising (1) an intermediate layer and (2) two surface layers formed on opposite sides of said intermediate layer;

said intermediate layer (1) comprising (a) a central layer made of a nonwoven glass fiber fabric impregnated with a resin composition containing a thermosetting resin and an inorganic filler and (b) upper and lower layers formed on opposite sides of said central layer (a), each of said upper and lower layers (b) being fabric free and consisting essentially of said resin composition containing a thermosetting resin and an inorganic resin, and wherein the two surface layers (2) formed on the intermediate layer are made of a thermosetting resin-impregnated fiber substrate.

2. A laminated board comprising (1) an intermediate layer and (2) two surface layers formed on opposite sides of said intermediate layer;

said intermediate layer comprising (a) a central layer made of a nonwoven glass fiber fabric impregnated with a resin composition containing a thermosetting resin and an inorganic filler and (b) upper and lower layers formed on opposite sides of said central layer, each of said upper and lower layers (b) consisting essentially of said resin composition of said thermosetting resin and said inorganic filler, and wherein the two surface layers (2) formed on the intermediate layer are made of a thermosetting resin-impregnated fiber substrate.

3. A laminated board according to claim 1, wherein in the resin composition, the proportion of the inorganic filler is 10–300% by weight based on the thermosetting resin.

4. A laminated board according to claim 2, wherein the inorganic filler is selected from the group consisting of aluminum hydroxide, magnesium hydroxide, calcium carbonate, clay, talc and silica.

5. A laminated board according to claim 2, wherein the thermosetting resin is selected from the group consisting of an epoxy resin, a polyimide resin, a polyester resin, a phenolic resin and an acrylic resin.

6. A laminated board according to claim 2, wherein the fiber substrate of said surface layers (2) is selected from the group consisting of a woven glass fiber fabric, a nonwoven glass fiber fabric, a woven or nonwoven synthetic fiber fabric, a kraft paper and a linter paper.

7. A laminated board according to claim 6, wherein the fiber substrate of said surface layers (2) is said woven glass fiber fabric.

8. A laminated board according to claim 6, wherein the fiber substrate of said surface layers (2) is selected from the group consisting of said kraft paper and said linter paper.

9. A laminated board according to claim 2, wherein said non-woven glass fiber fabric (a) has a unit area weight of 20–150 g/m$^2$.

10. A laminated board according to claim 2, wherein the inorganic filler in the resin composition is present in a proportion of 70–250% by weight based on the thermosetting resin.

* * * * *